United States Patent
Yu

(10) Patent No.: US 10,838,122 B2
(45) Date of Patent: Nov. 17, 2020

(54) COLOR FILTER SUBSTRATE AND FABRICATING METHOD THEREOF

(71) Applicant: Wuhan China Star Optoelectronics Technology Co., Ltd., Hubei (CN)

(72) Inventor: Xiaojiang Yu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 206 days.

(21) Appl. No.: 15/749,065

(22) PCT Filed: Oct. 26, 2017

(86) PCT No.: PCT/CN2017/107871
§ 371 (c)(1),
(2) Date: Oct. 29, 2018

(87) PCT Pub. No.: WO2019/056472
PCT Pub. Date: Mar. 28, 2019

(65) Prior Publication Data
US 2020/0233126 A1 Jul. 23, 2020

(30) Foreign Application Priority Data

Sep. 20, 2017 (CN) .......................... 2017 1 0853159

(51) Int. Cl.
*G02B 5/20* (2006.01)
*G03F 7/00* (2006.01)
*G02F 1/1335* (2006.01)

(52) U.S. Cl.
CPC ............ *G02B 5/201* (2013.01); *G03F 7/0007* (2013.01); *G02F 1/133512* (2013.01); *G02F 1/133516* (2013.01)

(58) Field of Classification Search
CPC ......... G02F 1/133512; G02F 1/133514; G02F 1/13394; G02F 1/1339; G02F 1/133516; G02B 5/201; G03F 7/0007
See application file for complete search history.

(56) References Cited

U.S. PATENT DOCUMENTS

2015/0293279 A1* 10/2015 Pei .................... G02F 1/133516
359/891
2016/0274402 A1* 9/2016 Jang .................. G02F 1/133512

FOREIGN PATENT DOCUMENTS

CN           105896162 A      8/2016

* cited by examiner

*Primary Examiner* — Jade R Chwasz
(74) *Attorney, Agent, or Firm* — Hemisphere Law, PLLC; Zhigang Ma

(57) ABSTRACT

A color filter substrate and the fabricating method are provided. The color filter substrate comprises of the following elements. A glass substrate and a black matrix formed thereon. The black matrix includes a first ring protrusion on an edge thereof. Color resists, a planar layer and a photoresist spacer are disposed in sequence on the glass substrate. The planar layer includes a second ring protrusion formed thereon corresponding to a location of the first ring protrusion. A projection of the photoresist spacer on the glass substrate is inside the first ring protrusion and the second ring protrusion. A polyimide film is coated on the planar layer and the photoresist spacer. The second ring protrusions can block the backflow of the polyimide solution on the photoresist spacer, for reducing the halo area of polyimide film, increasing the open ratio of the panel and promoting the performance of the LTPS display.

15 Claims, 6 Drawing Sheets

Step 1 is forming a black matrix on a glass substrate, wherein the black matrix includes at least one first ring protrusion forming on an edge of the black matrix.

Step 2 is forming a plurality of color resists, a planar layer and a photoresist spacer in sequence, wherein the planar layer includes a second ring protrusion corresponding to a location of the at least one first ring protrusion, and a projection of the photoresist spacer on the glass substrate is inside the at least one first ring protrusion and inside the second ring protrusion.

Step 3 is coating a polyimide film on the planar layer and the photoresist spacer.

FIG. 5

COLOR FILTER SUBSTRATE AND FABRICATING METHOD THEREOF

RELATED APPLICATIONS

The present application is a National Phase of International Application Number PCT/CN2017/107871, filed Oct. 26, 2017, and claims the priority of China Application No. 201710853159.1, filed Sep. 20, 2017.

FIELD OF THE DISCLOSURE

The disclosure relates to a display panel technical field, and more particularly to a color filter substrate and the fabricating method thereof.

BACKGROUND

LTPS (Low Temperature Poly-Silicon) display panel is widely used in smart phones and tablets. In the fabricating process of the LTPS display panel, the array substrate and color filter substrate are attached together to form a TFT-LCD panel for controlling various color of passing light. The color filter substrate usually is fabricated with some photo spacers for controlling the thickness of cell gap. The steps of fabricating the photo spacers comprises of coating an organic layer, exposing the organic layer, and then etching the organic layer to form the photo spacers with desired shape and size, for controlling the height of cell gap after the array substrate and the color filter substrate are attached together. Before attaching the color filter substrate to the array substrate, it is required to form a polyimide film on the substrate to serve as an alignment film for controlling the orientation of the liquid crystal molecules. However, the polyimide solution on the periphery of the photo spacer is easy to flow back to cause halo effect. The portion of the polyimide film with halo effect would be thicker than other portions of the polyimide film, so the orientations of the liquid crystal molecules in halo area are different with others. Therefore, the black matrix is usually disposed below the halo area to block the light passing through the halo area.

FIG. 1 and FIG. 2 illustrate the structure of a color filter substrate of a common LIPS display panel currently. FIG. 1 is a top view showing the color filter substrate. FIG. 2 is a cross-sectional view of the color filter substrate along the line AA' in FIG. 1.

In FIG. 1, 3' is a color resist; 5' is a photo spacer; 6' is a polyimide film around the photo spacer (the halo usually occurs on peripheral area of the photo spacer). In FIG. 2, 2' is a glass substrate; 1' is a black matrix on the glass substrate; 3' is the color resist; 7' is another color resist; 4' is an over coated planar layer; 5' is the photo spacer; 6' is the polyimide film around the photo spacer. As shown in FIG. 2, the photo spacer protrudes on the color filter substrate. When the polyimide film is coated, the polyimide solution is easy to flow back from the periphery of the photo spacer and accumulates to cause the halo effect. The polyimide film in the halo area is thicker and cause the orientations of the liquid crystal molecules in halo area are different with those molecules in other areas. Therefore, the black matrix 1' is disposed below the halo area to block the light passing through the halo area in the fabricating process of color filter substrate. Accordingly, reducing the size of halo would be beneficial for shrinking the size of the black matrix, reducing the mura caused by the polyimide film and increasing the open ratio of the display panel.

SUMMARY

For solving the technical issues, the present invention provides a color filter substrate and the fabricating method thereof.

For solving the above technical issues, a color filter substrate provided by the present invention comprises of the following elements.

A glass substrate and a black matrix formed on the glass substrate. The black matrix includes at least one first ring protrusion on an edge of the black matrix.

A plurality of color resists, a planar layer and a photoresist spacer are disposed in sequence from bottom to top on the glass substrate with the black matrix.

The planar layer includes a second ring protrusion formed thereon corresponding to a location of the at least one first ring protrusion. A projection of the photoresist spacer on the glass substrate is inside the at least one first ring protrusion and the second ring protrusion.

A polyimide film is coated on the planar layer and the photoresist spacer.

In one embodiment, the black matrix includes a plurality of the first ring protrusions formed on the edge of the black matrix. The plurality of the first ring protrusions are arranged in concentric circles.

In one embodiment, the planar layer includes a plurality of the second ring protrusions corresponding to the locations of the first ring protrusions. Similarly, the second ring protrusions are also arranged in concentric circles.

A fabricating method of the color filter substrate also provided by the present invention comprises of the following steps.

A black matrix is formed on a glass substrate. The black matrix includes at least one first ring protrusion forming on an edge of the black matrix.

A plurality of color resists, a planar layer and a photoresist spacer are formed in sequence. The planar layer includes a second ring protrusion corresponding to a location of the first ring protrusion. A projection of the photoresist spacer on the glass substrate is inside the first ring protrusion and inside the second ring protrusion.

A polyimide film is coated on the planar layer and the photoresist spacer.

In one embodiment, the step of forming the black matrix including at least one first ring protrusion formed on the edge of the black matrix on the glass substrate further comprises the steps of coating a photoresist layer on the glass substrate for fabricating the black matrix; applying a half-tone mask with three transmittance to perform an exposing procedure on the glass substrate with the photoresist layer: and etching the glass substrate after the exposing procedure to form a pattern of the black matrix and the at least one first ring protrusion forming on the edge of the black matrix.

In one embodiment, the half-tone mask includes high transparent areas, semitransparent areas and nontransparent areas, wherein the high transparent areas are located at two ends of the half-tone mask, the semitransparent areas are located between the high transparent areas, and the nontransparent areas are located at two ends of the semitransparent areas.

In one embodiment, after the step of applying a half-tone mask with three transmittances to perform an exposing procedure on the glass substrate with the photoresist layer, the photoresist layer includes completely reacted areas corresponding to the high transparent areas, partially reacted areas corresponding to the semitransparent areas, and unreacted areas corresponding to the nontransparent areas.

In one embodiment, the completely reacted areas of the photoresist layer are completely removed, the partially reacted areas of the photoresist layer are partially removed, and the unreacted areas of the photoresist layer are reserved to form the first ring protrusion in the step of etching the glass substrate after the exposing procedure.

In one embodiment, the half-tone mask includes multiple nontransparent areas, and after the exposing procedure the photoresist layer has multiple unreacted areas, and after the step of etching the glass substrate the multiple unreacted areas of the photoresist layer are reserved to form a plurality of the first ring protrusion, and the plurality of the first ring protrusion are arranged in concentric circles.

In one embodiment, the planar layer is formed with a plurality of second ring protrusions corresponding to the location of the plurality of the first ring protrusion, and the plurality of the second ring protrusions are arranged in concentric circles.

The present invention has at least following advantages. The black matrix formed on the glass substrate includes at least one first ring protrusion on the edge of the black matrix, so when the planar layer is fabricated later the planar layer includes the second ring protrusions formed corresponding to the location of the first ring protrusions. The projection of the photoresist spacer on the glass substrate is inside the first ring protrusions and inside the second ring protrusions. Namely, the second ring protrusions are located on the periphery of the photoresist spacer. When the polyimide film is coated, the second ring protrusions can block the backflow of the polyimide solution on the periphery of the photoresist spacer, for reducing the halo area of polyimide film, increasing the open ratio of the display panel and promoting the display performance of the LTPS display panel.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures:

FIG. 5 is a flowing chart illustrating the steps of fabricating a color filter substrate in second embodiment of the present invention.

DETAILED DESCRIPTION OF PREFERRED EMBODIMENTS

Figure 1:
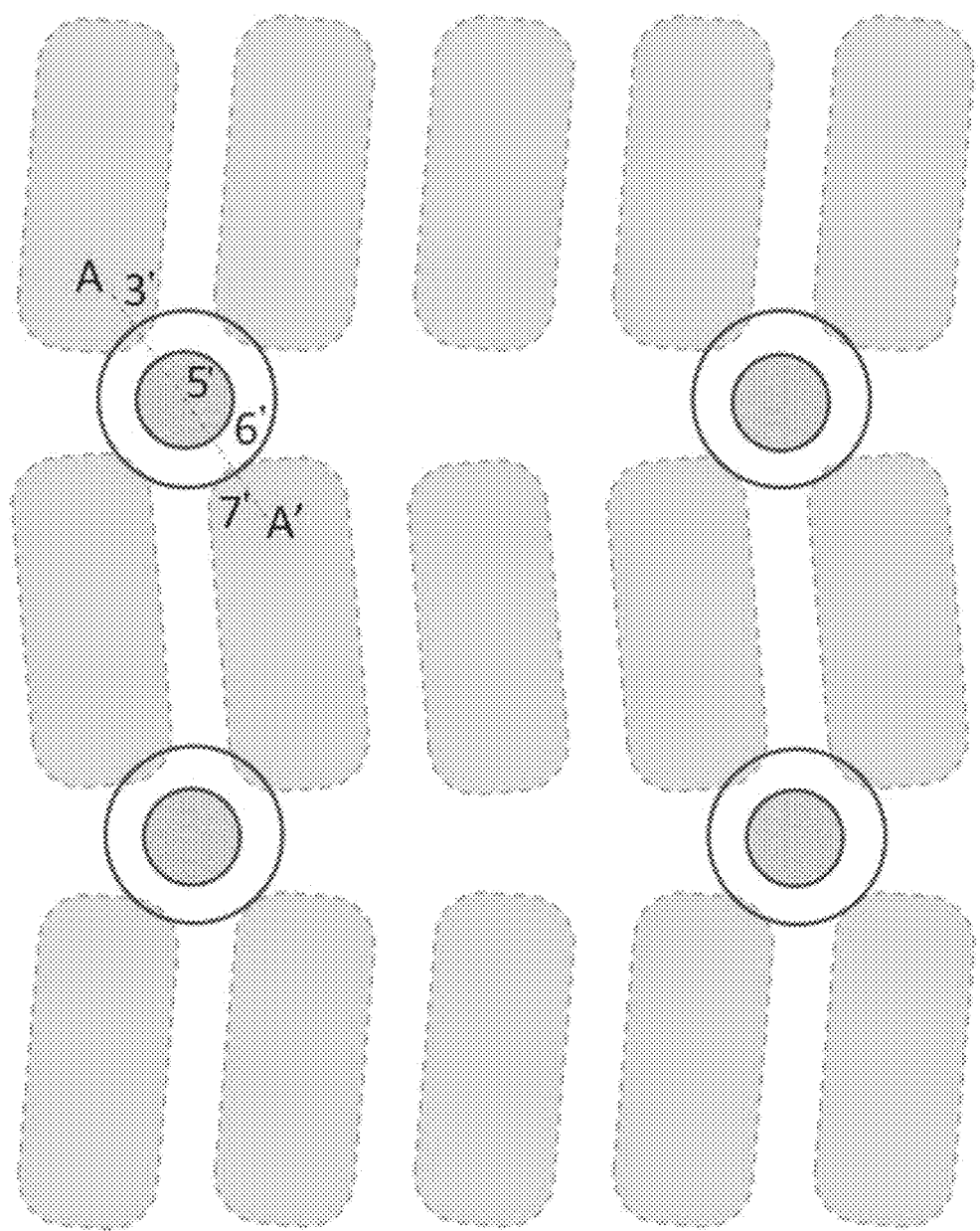
FIG. 1 is a top view of a current color filter substrate.
Figure 2:
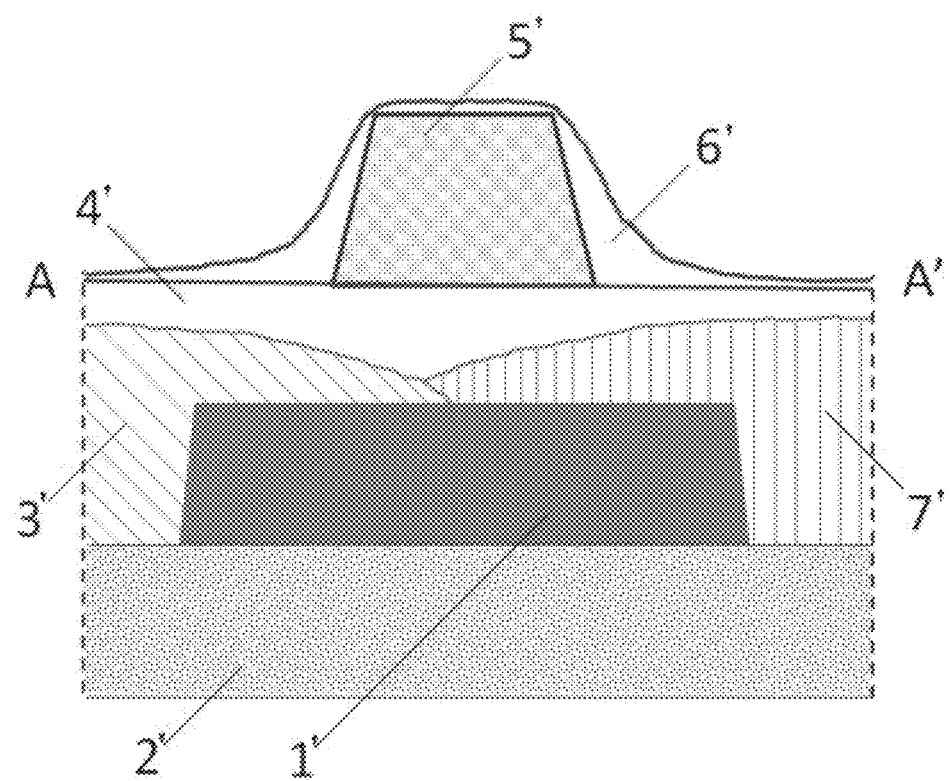
FIG. 2 is a cross-sectional view of the color filter substrate along the line AA' in FIG. 1.
Figure 3:
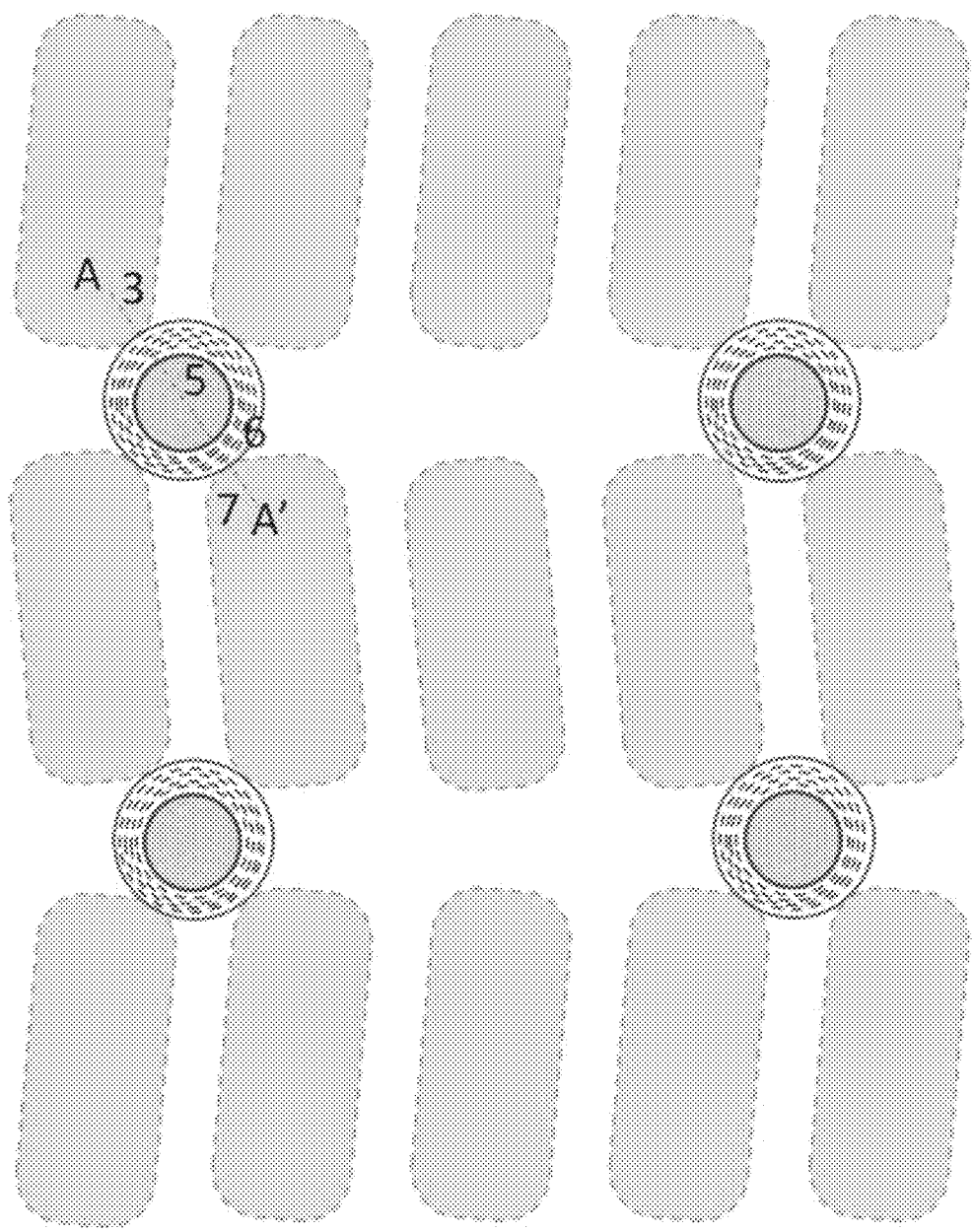
FIG. 3 is a top view of a color filter substrate in first embodiment of the present invention.
Figure 4:
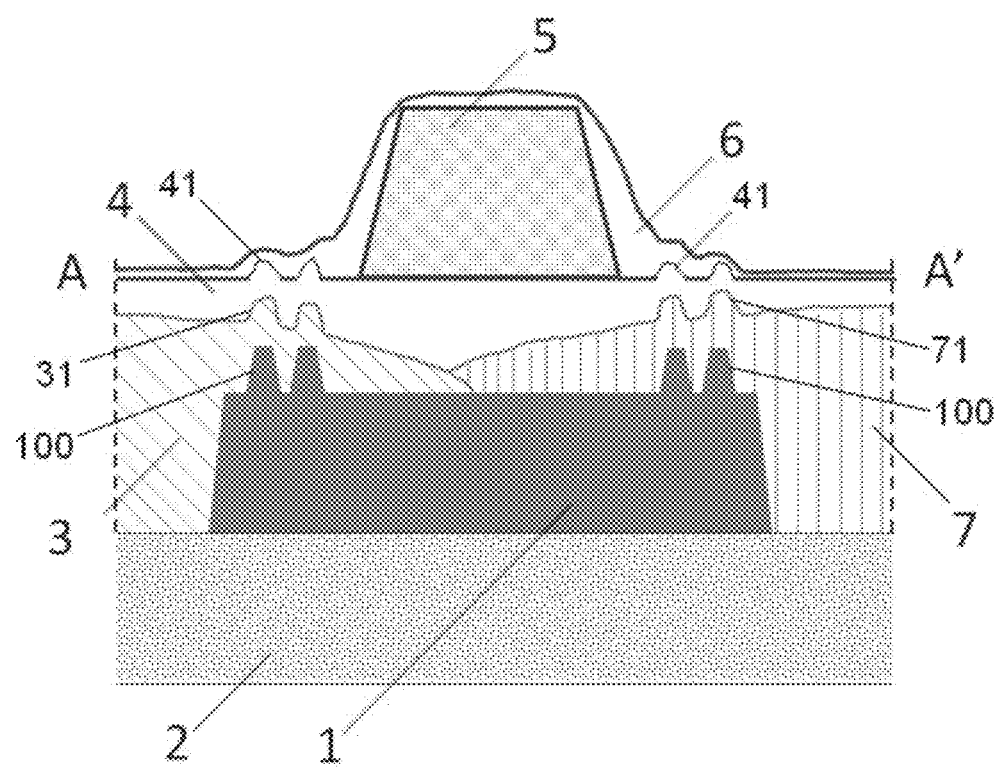
FIG. 4 is a cross-sectional view of the color filter substrate along the line AA' in FIG. 3.

The disclosure will be further described in detail with reference to accompanying drawings and preferred embodiments as follows. The specific structural and functional details disclosed herein are only representative and are intended for describing exemplary embodiments of the disclosure. However, the disclosure can be embodied in many forms of substitution, and should not be interpreted as merely limited to the embodiments described herein. All other embodiments obtained by persons of ordinary skill in the art based on the embodiments of the present invention without creative efforts shall fall within the protection scope of the present invention.

please refer to FIG. 3 and FIG. 4, a color filter substrate provided in the first embodiment of the present invention comprises of the following elements.

A glass substrate 2 and a black matrix 1 formed on the glass substrate 2. The black matrix 1 includes at least one first ring protrusion 100 on an edge of the black matrix 1.

A plurality of color resists, a planar layer 4 and a photoresist spacer 5 are disposed in sequence from bottom to top on the glass substrate 2 with the black matrix 1.

The planar layer 4 includes a second ring protrusion 41 formed thereon corresponding to a location of the at least one first ring protrusion 100. A projection of the photoresist spacer 5 vertically on the glass substrate 2 is inside the at least one first ring protrusion 100 and inside the second ring protrusion 41.

A polyimide film 6 is coated on the planar layer 4 and the photoresist spacer 5.

When the black matrix 1 is formed on the glass substrate 2, at least one first ring protrusion 100 is formed on the edge of the black matrix 1 on the color filter substrate in this embodiment. Therefore, when the planar layer 4 is fabricated later, the second ring protrusion 41 is formed on the planar layer 4 corresponding to the location of the first ring protrusion 100. The projection of the photoresist spacer 5 vertically on the glass substrate 2 is inside the first ring protrusion 100 and inside the second ring protrusion 41. Namely, the second ring protrusion 41 is surrounding on the periphery of the photoresist spacer 5. When the polyimide film 6 is coated, the second ring protrusion 41 can prevent the polyimide solution from flowing back to reduce the halo area of polyimide film.

For further promoting the performance of blocking the backflow of the polyimide solution on the periphery of the photoresist spacer 5, the black matrix includes a plurality of the first ring protrusions 100 formed on the edge of the black matrix. The plurality of the first ring protrusions 100 are arranged in concentric circles. Conforming to the first ring protrusions 100, the planar layer 4 includes a plurality of the second ring protrusions 41 corresponding to the locations of the first ring protrusions 100. Similarly, the second ring protrusions 41 are also arranged in concentric circles.

Besides, the color resists formed above the black matrix include a third protrusion corresponding to the location of the first ring protrusion 100. As shown in FIG. 4, a first color resist 3 includes a third protrusion 31 formed thereon corresponding to the location of the first ring protrusion 100, and a second color resist 7 includes a third protrusion 71 formed thereon corresponding to the location of the first ring protrusion 100.

Please refer to FIG. 5, corresponding to the first embodiment of the present invention, a fabricating method of the color filter substrate provided in a second embodiment of the present invention comprises of the following steps.

Step 1 is to form a black matrix on a glass substrate. The black matrix includes at least one first ring protrusion forming on an edge of the black matrix.

Step 2 is to form a plurality of color resists, a planar layer and a photoresist spacer in sequence. The planar layer includes a second ring protrusion corresponding to a location of the first ring protrusion. A projection of the photoresist spacer vertically on the glass substrate is inside the first ring protrusion and inside the second ring protrusion.

Step 3 is to coat a polyimide film on the planar layer and the photoresist spacer.

Figure 6:
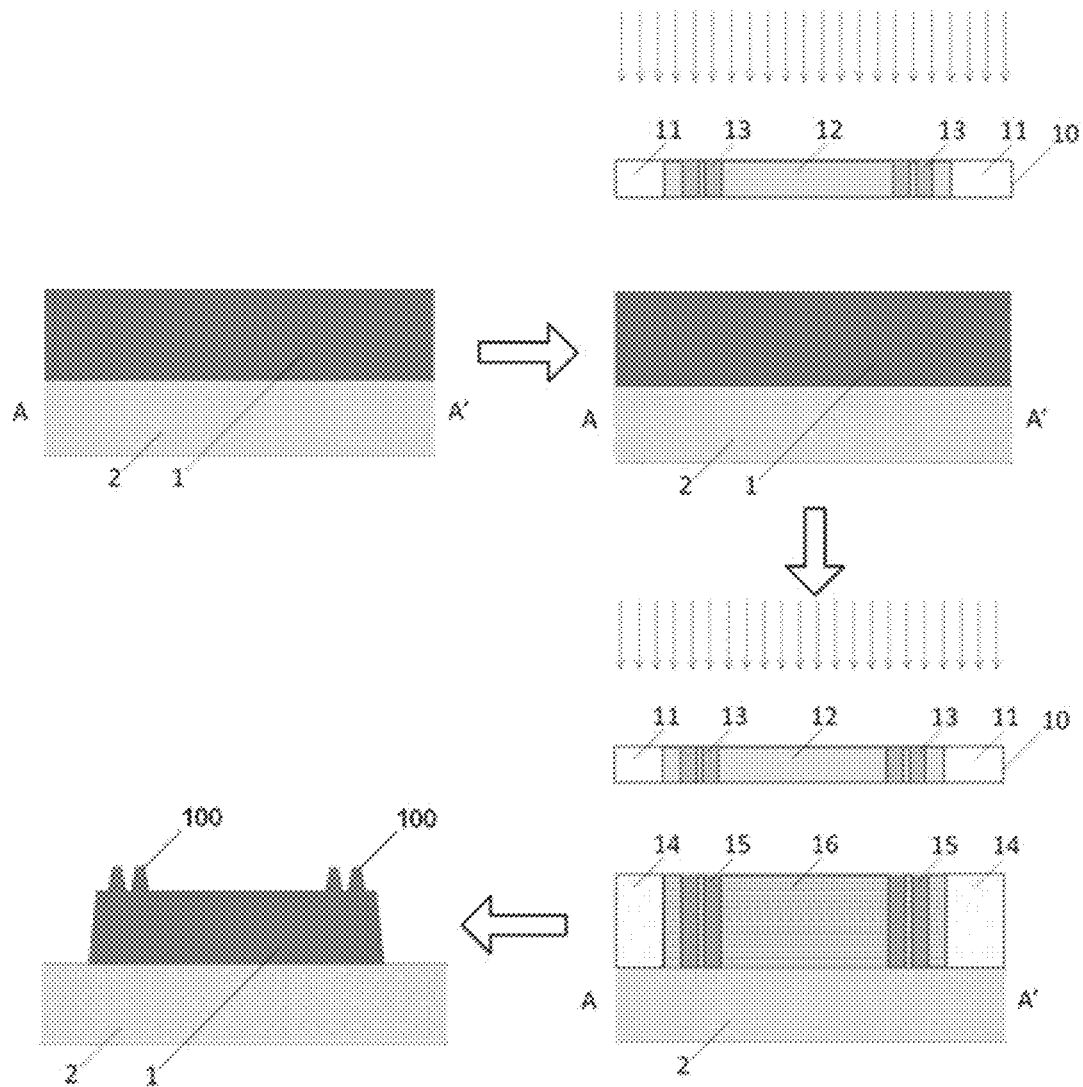
FIG. 6 is a serial of the cross-sectional views of the color filter substrate for illustrating the steps of fabricating a color filter substrate in second embodiment of the present invention.

In specific, referring to FIG. 6, different with current technology, the black matrix 1, in this embodiment has a special structure, including at least one first ring protrusion formed on the edge of the black matrix 1. Therefore, the fabricating process is also different with that in current technology. The detailed description is as follows.

First, a photoresist layer is coated on the glass substrate 2 for fabricating the black matrix 1.

Then, a half-tone mask with three transmittances is applied to perform an exposing procedure on the glass substrate 2 with the photoresist layer.

After the exposing procedure is performed, the glass substrate 2 is etched to form a pattern of the black matrix 1 and the at least one first ring protrusion on the edge of the black matrix 1.

FIG. 6 illustrates the half-tone mask 10 including three areas with different transmittance. The three areas on the half-tone mask 10 are the high transparent areas 11, the semitransparent areas 12 and the nontransparent areas 13. The high transparent areas 11 are located at two ends of the half-tone mask 10. The semitransparent areas 12 are located between the high transparent areas 11. The nontransparent areas 13 are located at two ends of the semitransparent areas 12.

After applying the half-tone mask 10 to perform an exposing procedure on the glass substrate 2, corresponding to three areas with different transmittance on the half-tone mask 10, the photoresist layer also includes three reacted areas. The three reacted areas are completely reacted areas 14, partially reacted areas 16 and unreacted areas 15.

Then, the exposed glass substrate 2 is etched. The completely reacted areas 14 of the photoresist layer are completely removed. The partially reacted areas 16 of the photoresist layer are partially removed. The unreacted areas of the photoresist layer are reserved in the etching procedure to form the first ring protrusion 100.

After the black matrix is fabricated, the color resists 3 and 7, the planar layer 4 and the photoresist spacer 5 are also fabricated thereon. Because the black matrix 1 includes at least one first ring protrusion 100 on the edge of the black matrix 1, the planar layer 4, fabricated later, includes the second ring protrusion 41 thereon corresponding to the location of the first ring protrusion 100. When the photo spacer 5 is formed, the projection of the photoresist spacer 5 vertically on the glass substrate 2 is inside the first ring protrusion 100 and is also inside the second ring protrusion 41, as shown in FIG. 4. Thus, when the polyimide film 6 is coated, the second ring protrusion 41 can block the backflow of the polyimide solution on the periphery of the photoresist spacer 5, for reducing the halo area of polyimide film, increasing the open ratio of the display panel and promoting the display performance of the LTPS display panel.

For further promoting the performance of blocking the backflow of the polyimide solution on the periphery of the photoresist spacer 5, the half-tone mask 10 is made to include multiple the nontransparent areas 13. Therefore, after the exposing procedure, the photoresist layer also includes multiple the unreacted areas 15. Then, after the etching step, the multiple unreacted areas 15 would be reserved to form multiple the first ring protrusions 100. These multiple first ring protrusions 100 are arranged in concentric circles. Conforming to the multiple first ring protrusions 100, the planar layer 4 includes multiple the second ring protrusions 41 corresponding to the locations of the first ring protrusions 100. Similarly, the multiple second ring protrusions 41 are also arranged in concentric circles.

Besides, when the color resists are formed, the color resists above the black matrix include the third protrusions corresponding to the locations of the first ring protrusions 100. As shown in FIG. 4, a first color resist 3 includes the third protrusions 31 formed thereon corresponding to the locations of the first ring protrusions 100, and similarly a second color resist 7 includes the third protrusions 71 formed thereon corresponding to the locations of the first ring protrusions 100.

According to above description, it is understandable that the present invention has at least following advantages. The black matrix formed on the glass substrate includes at least one first ring protrusion on the edge of the black matrix, so when the planar layer is fabricated later the planar layer includes the second ring protrusions formed corresponding to the location of the first ring protrusions. The projection of the photoresist spacer on the glass substrate is inside the first ring protrusions and inside the second ring protrusions. Namely, the second ring protrusions are located on the periphery of the photoresist spacer. When the polyimide film is coated, the second ring protrusions can block the backflow of the polyimide solution on the periphery of the photoresist spacer, for reducing the halo area of polyimide film, increasing the open ratio of the display panel and promoting the display performance of the LTPS display panel.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A color filter substrate, comprising of:
   a glass substrate and a black matrix formed on said glass substrate, said black matrix including at least one first ring protrusion on an edge of said black matrix;
   a plurality of color resists, a planar layer and a photoresist spacer disposed in sequence from bottom to top on said glass substrate with said black matrix, and thereby said planar layer is located between said plurality of color resists and said photoresist spacer as well as between said black matrix and said photoresist spacer;
   said planar layer including a second ring protrusion formed corresponding to a location of said at least one first ring protrusion, wherein a projection of said photoresist spacer on said glass substrate is inside said at least one first ring protrusion and inside said second ring protrusion; and
   a polyimide film coated on said planar layer and said photoresist spacer, and thereby said photoresist spacer is located between said polyimide film and said planar layer;
   wherein said at least one first ring protrusion is located at one of two opposite sides of said planar layer, and said photoresist spacer is located at the other one of said two opposite sides of said planar layer.

2. The color filter substrate according to claim 1, wherein said black matrix includes a plurality of said first ring protrusions formed on said edge of said black matrix, and said plurality of said first ring protrusions are arranged in concentric circles.

3. The color filter substrate according to claim 2, wherein said planar layer includes a plurality of said second ring protrusions corresponding to said locations of said plurality of said first ring protrusions, and said plurality of said second ring protrusions are arranged in concentric circles.

4. The color filter substrate according to claim 1, wherein said plurality of color resists formed above said black matrix comprise third protrusions, and said third protrusions are located between said at least one first ring protrusion and said second ring protrusion.

5. The color filter substrate according to claim 1, wherein said second ring protrusion is spaced from and surrounding said photoresist spacer.

6. The color filter substrate according to claim 1, wherein said black matrix and said at least one first ring protrusion are made from a same photoresist layer.

7. A method of forming a color filter substrate, comprising the steps of:
   forming a black matrix on a glass substrate, wherein said black matrix includes at least one first ring protrusion forming on an edge of said black matrix;
   forming a plurality of color resists, a planar layer and a photoresist spacer in sequence on said glass substrate with said black matrix, wherein said planar layer includes a second ring protrusion corresponding to a location of said at least one first ring protrusion and surrounding said photoresist spacer, and a projection of said photoresist spacer on said glass substrate is inside said at least one first ring protrusion and inside said second ring protrusion; and
   coating a polyimide film on said planar layer and said photoresist spacer by using a polyimide solution, and said second ring protrusions blocking a backflow of said polyimide solution on a periphery of said photoresist spacer;
   wherein said at least one first ring protrusion is located at one of two opposite sides of said planar layer, and said photoresist spacer is located at the other one of said two opposite sides of said planar layer.

8. The method according to claim 7, wherein said step of forming said black matrix including at least one first ring protrusion formed on said edge of said black matrix on said glass substrate, further comprises the steps of:
   coating a photoresist layer on said glass substrate for fabricating said black matrix;
   applying a half-tone mask with three transmittances to perform an exposing procedure on said glass substrate with said photoresist layer; and
   etching said glass substrate after said exposing procedure to form a pattern of said black matrix and said at least one first ring protrusion forming on said edge of said black matrix.

9. The method according to claim 8, wherein said half-tone mask includes high transparent areas, semitransparent areas and nontransparent areas, wherein said high transparent areas are located at two ends of said half-tone mask, said semitransparent areas are located between said high transparent areas, and said nontransparent areas are located at two ends of said semitransparent areas.

10. The method according to claim 9, wherein after the step of applying a half-tone mask with three transmittances to perform an exposing procedure on said glass substrate with said photoresist layer, said photoresist layer includes completely reacted areas corresponding to said high transparent areas, partially reacted areas corresponding to said semitransparent areas, and unreacted areas corresponding to said nontransparent areas.

11. The method according to claim 10, wherein said completely reacted areas of said photoresist layer are completely removed, said partially reacted areas of said photoresist layer are partially removed, and said unreacted areas of said photoresist layer are reserved to form said first ring protrusion in the step of etching said glass substrate after said exposing procedure.

12. The method according to claim 10, wherein said half-tone mask includes multiple nontransparent areas, and after said exposing procedure said photoresist layer has multiple unreacted areas, and after said step of etching said glass substrate said multiple unreacted areas of said photoresist layer are reserved to form a plurality of said first ring protrusion, and said plurality of said first ring protrusion are arranged in concentric circles.

13. The method according to claim 12, wherein said planar layer is formed with a plurality of second ring protrusions corresponding to said location of said plurality of said first ring protrusion, and said plurality of said second ring protrusions are arranged in concentric circles.

14. The method according to claim 7, wherein said plurality of color resists formed above said black matrix comprise third protrusions, and said third protrusions are located between said at least one first ring protrusion and said second ring protrusion.

15. The method according to claim 7, wherein said second ring protrusion is spaced from said photoresist spacer, and said photoresist spacer is covered by said polyimide film.

* * * * *